US008698312B2

(12) United States Patent
Werking et al.

(10) Patent No.: US 8,698,312 B2
(45) Date of Patent: Apr. 15, 2014

(54) SEMICONDUCTOR DEVICE INCLUDING A HYBRID METALLIZATION LAYER STACK FOR ENHANCED MECHANICAL STRENGTH DURING AND AFTER PACKAGING

(75) Inventors: James Werking, Fishkill, NY (US); Frank Feustel, Dresden (DE); Christian Zistl, Dresden (DE); Peter Huebler, Coswig (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1534 days.

(21) Appl. No.: 11/046,986

(22) Filed: Jan. 31, 2005

(65) Prior Publication Data

US 2005/0242435 A1 Nov. 3, 2005

(30) Foreign Application Priority Data

Apr. 30, 2004 (DE) .......................... 10 2004 021 261

(51) Int. Cl.
*H01L 23/48* (2006.01)
(52) U.S. Cl.
USPC ......................................... 257/758; 257/734

(58) Field of Classification Search
USPC .................. 257/760, 734, 750, 753, 758, 759
See application file for complete search history.

(56) References Cited

U.S. PATENT DOCUMENTS

| 6,448,654 | B1 | 9/2002 | Gabriel et al. | 257/758 |
| 6,511,908 | B2 | 1/2003 | Kinoshita et al. | 438/637 |
| 6,569,767 | B1 | 5/2003 | Fujisawa et al. | 438/687 |
| 6,690,091 | B1 | 2/2004 | Chooi et al. | 257/758 |
| 6,747,355 | B2 | 6/2004 | Abiru et al. | 257/758 |
| 7,259,090 | B2* | 8/2007 | Wu et al. | 438/627 |
| 2003/0020163 | A1 | 1/2003 | Hung et al. | 257/734 |

* cited by examiner

*Primary Examiner* — Jack Chen
(74) *Attorney, Agent, or Firm* — Amerson Law Firm, PLLC (57) ABSTRACT

The introduction of dielectric material of enhanced mechanical stability, such as silicon dioxide or fluorine-doped silicon dioxide, into the via level of a low-k interconnect structure provides an increased overall mechanical stability, especially during the packaging of the device. Consequently, cracking and delamination, as frequently observed in high end low-k interconnect structures, may significantly be reduced, even if organic package substrates are used.

19 Claims, 3 Drawing Sheets

SEMICONDUCTOR DEVICE INCLUDING A HYBRID METALLIZATION LAYER STACK FOR ENHANCED MECHANICAL STRENGTH DURING AND AFTER PACKAGING

BACKGROUND OF THE INVENTION

1. Field of the Invention

Generally, the present invention relates to the fabrication of integrated circuits, and, more particularly, to the formation of metallization layers of reduced permittivity and packaging issues associated therewith.

2. Description of the Related Art

Semiconductor devices are typically formed on substantially disc-shaped substrates made of any appropriate material. The majority of semiconductor devices including highly complex electronic circuits is currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs ASICs (application specific ICs) and the like. The individual integrated circuits are arranged in an array form, wherein most of the manufacturing steps, which may involve up to 500 and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size to actually use as much substrate area as possible for semiconductor devices and/or test structures that may be used for process control. In the attempt to maximize the useful surface area for a given substrate size, the feature sizes of circuit elements are steadily scaled down and the peripheral chip areas are positioned as closely as possible to the substrate perimeter as it is compatible with substrate handling processes. Generally, most of the manufacturing processes are performed in an automated manner, wherein the substrate handling is performed at the back side of the substrate and/or the substrate edge.

Due to the ongoing demand for shrinking the feature sizes of highly sophisticated semiconductor devices, copper in combination with a low-K dielectric material has become a frequently used alternative in the formation of so-called interconnect structures comprising metal line layers and intermediate via layers that include metal lines as intra-layer connections and vias as inter-layer connections which commonly connect individual circuit elements to provide the required functionality of the integrated circuit. Typically, a plurality of metal line layers and via layers stacked on top of each other is necessary to realize the connections between all internal circuit elements and I/O (input/output) power and ground pads of the circuit design under consideration. Hereby, the metal lines provide the electrical connections within a single metallization layer, whereas the vias are formed through the interlayer dielectric material to connect two metal lines of vertically adjacent metallization layers.

For extremely scaled integrated circuits, the signal propagation delay is no longer limited by the field effect transistors but is limited, owing to the increased density of circuit elements requiring an even more increased number of electrical connections, by the close proximity of the metal lines, since the line-to-line capacitance is increased in combination with a reduced conductivity of the lines due to a reduced cross-sectional area. For this reason, traditional dielectrics such as silicon dioxide (k>3.6) and silicon nitride (k>5) are replaced by dielectric materials having a lower permittivity, which are therefore also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the interconnect structure and any subsequent manufacturing processes of integrated circuits, production yield may be adversely affected by delamination of material residues, especially at the substrate edge where most of the substrate handling takes place, whereby delamination of such low-k layers, and thus substrate contamination, is substantially caused by the reduced mechanical stability of the low-k interconnect structure.

This situation may increase in subsequent manufacturing processes with the increasing introduction of flip-chip packaging techniques. As is generally acknowledged flip-chip packaging provides advantages in view of performance due to reduced lead lengths and I/O density, as substantially the whole chip area may be used for forming bumps that are to be connected with corresponding bumps or pads of a carrier or package substrate. During the process of attaching the package substrate to the chip including the low-k interconnect structure and a bump layer, a certain amount of pressure and/or heat is applied to the composite device to establish a reliable connection between each of the bumps of the chip and the bumps or pads of the package substrate. The heat and/or mechanical stress during the packaging may, however, affect the low-k interconnect structure.

In modern microprocessors, where a large number of I/O lines are required, up to several hundred or several thousand bumps are reliably to be connected with the corresponding bumps or pads of the package substrate. Hence, especially in microprocessors built with a low-k dielectric interconnect structure, the probability for cracking and delamination in the interconnect structure formed of the low-k dielectric of reduced mechanical strength is remarkably increased and a decrease of production yield may be observed, thereby partly off-setting the advantages obtained by increasing the substrate size and minimizing substrate edge regions. The problem is even exacerbated when the microprocessor chips are to be attached to organic package substrates, owing to the significant thermal mismatch between silicon and the organic material forming the package substrate. Moreover, even though under-fill materials are typically introduced into the space between the package substrate and the attached silicon chip to compensate a portion of the mechanical stress caused by the different coefficients of the thermal expansion, the reduced mechanical stability of inter-connect structures comprised of low-k dielectrics may even negatively affect the failure rate during the operation of the device.

Figure 1A:
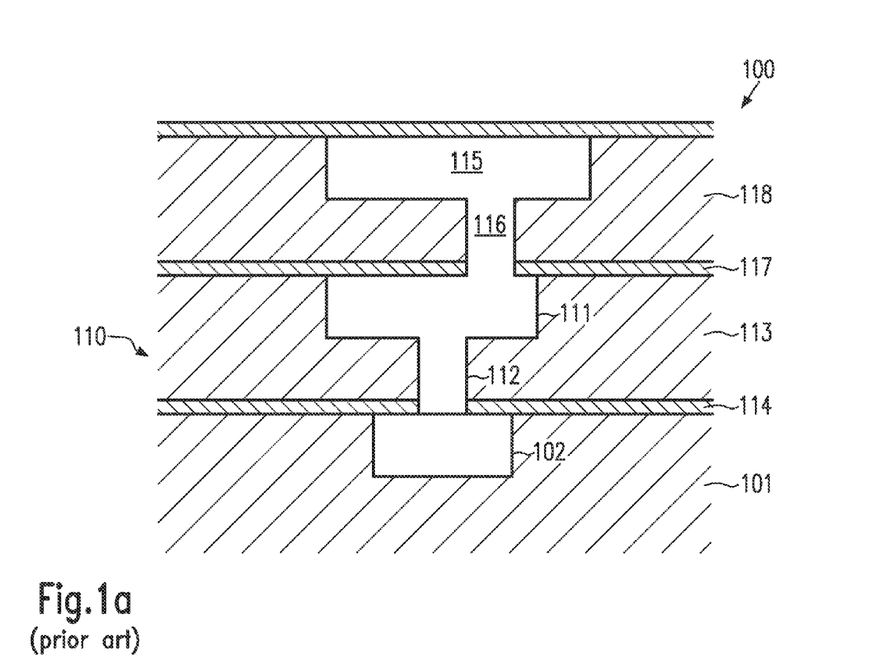
FIG. 1a schematically illustrates a cross-sectional view of a conventional advanced integrated circuit formed corresponding to a 130 nm technology and including a low-k interconnect structure.
Figure 1B:
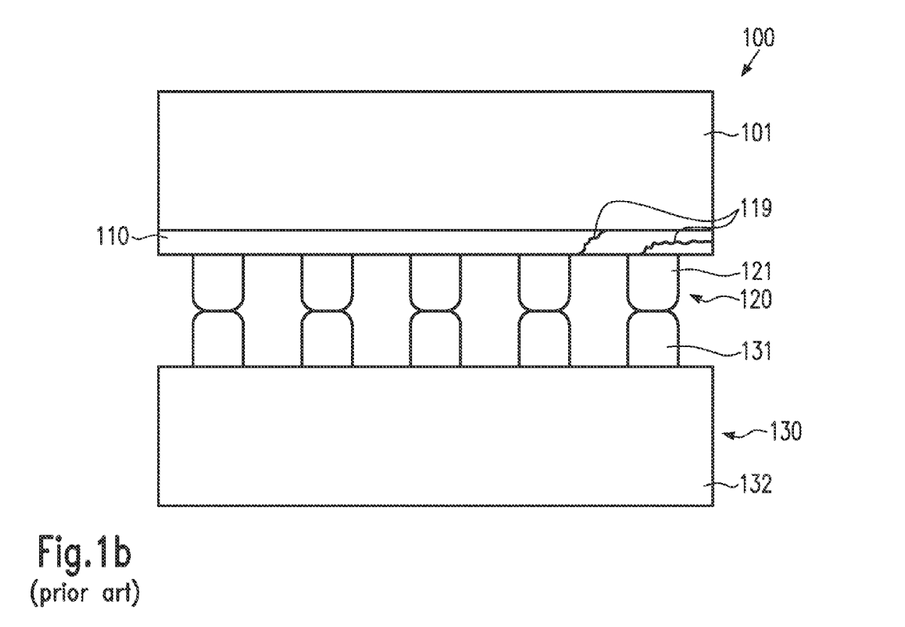
FIG. 1b schematically shows the conventional semiconductor device with an organic package substrate attached thereto, wherein increased cracking and delamination in the low-k interconnect structure may be observed.

With reference to FIGS. 1a and 1b, the problems involved in packaging a semiconductor device having an interconnect structure comprised of a low-k dielectric are discussed in more detail.

FIG. 1a schematically shows a cross-sectional view of a semiconductor device 100 including an interconnect structure 110 formed of a low-k dielectric material for a device having, for example, a critical design dimension of 130 nm. The semiconductor device 100 comprises a substrate 101, which includes a large number of circuit elements, such as transistors, capacitors and the like, or which may include further metal line layers and intermediate via layers that are for convenience not shown in FIG. 1a. Instead, and representative of any of the above-mentioned circuit features, a contact portion 102 is illustrated and is connected to the above located interconnect structure 110. The interconnect structure 110 comprises a first metal line 111 and a first via 112 formed in a low-k dielectric layer 113. The metal line 111 may be comprised of copper and a conductive barrier layer, such as a tantalum/tantalum nitride layer located between the copper and the dielectric material 113. Similarly, the via 112 may be filled with copper and may be separated from the dielectric material 113 by a conductive barrier layer. For convenience, any details of the metal line 111 and the via 112 are not shown in FIG. 1a. A capping layer 114 is located between the dielectric layer 113 and the substrate 101. For example, the low-k dielectric layer 113 may be comprised of hydrogenated silicon oxycarbide (SiCOH) and the capping layer 114 may be comprised of nitrogen-enriched silicon carbide (SiCN). The interconnect structure 110 further comprises a second metal line 115 connected to a second via 116, which, in turn, is connected to the first metal line 111. The second metal line 115 and the second via 116 are formed in a second low-k dielectric layer 118, which, in turn, is separated from the first low-k dielectric layer 113 by a further capping layer 117. Regarding the material composition of the metal line 115, the via 116, the second low-k dielectric layer 118 and the capping layer 117, the same materials may be used as in the corresponding components of the underlying metallization layer. It should be appreciated that typically a plurality of first metal lines 111 is provided in the low-k dielectric layer 113, which may be connected by corresponding vias 112 to any lower lying regions or layers. The same holds true for the second metal lines 115 and the second vias 116 in the second low-k dielectric layer 118. Due to the relatively low permittivity of the layers 113 and 118, for instance 3 or less, the capacitance between neighboring first metal lines 111 and between neighboring second metal lines 115 is reduced compared to an interconnect structure 110 having formed therein dielectric layers 113, 118 comprised of silicon dioxide. The semiconductor device 100, when representing an advanced microprocessor of the 130 nm technology node, may include up to eight metal line layers which are connected to each other via corresponding intermediate via layers. Consequently, the interconnect structure 100 as shown in FIG. 1a exhibits a significantly reduced mechanical stability for the benefit of an increased operating speed.

FIG. 1b schematically shows the semiconductor device 100 with a bump layer 120 formed above the interconnect structure 110 and attached to the bump layer 120 is a package substrate 130. The package substrate 130 comprises a base portion 132, which may be comprised of an organic material in view of economic constraints, and may also include a plurality of bumps or contact pads 131, which match in position and size corresponding bumps 121 formed in the bump layer 120. Owing to a mismatch in the thermal expansion coefficient between the base portion 132 and the substrate 101, delamination and cracking 119 may occur in the interconnect structure 110 during and after attaching the package. substrate 130 to the bump layer 120, which may, however, lead to a significantly reduced production yield during the fabrication of the device 100 and to an increased failure rate during the operation of the packaged device 100.

A typical process flow for forming the semiconductor device 100 as shown in FIGS. 1a and 1b may comprise the following processes. After forming any circuit elements and any contact regions, such as the portion 102, in and on the substrate 101, the capping layer 114 may be formed followed by the formation of the dielectric layer 113, wherein, for instance, a plasma enhanced chemical vapor deposition (PECVD) process may be employed for SiCOH, whereas advanced spin-on techniques may be used for low-k polymer materials. Thereafter, trenches and corresponding via openings may be formed in the dielectric layer 113 by, for instance, well approved via-first-trench-last approaches based on established photolithography and etch techniques, wherein the capping layer 114 may serve as an etch stop layer for the etch process to form the via opening. However, depending on the critical design dimensions, other well-established regimes, such as a trench-first-via-last approach, may be employed. Thereafter, conductive barrier layers and possibly seed layers may be formed by appropriate techniques, such as sputter deposition, and finally the copper may be filled in by, for instance, electroplating, wherein any excess metal may be removed by chemical mechanical polishing. Thereafter, the capping layer 117 may be formed by substantially the same process sequence as described above to form the metal lines 115 and the vias 116 in the dielectric layer 118. After all of the metal line levels and via levels of the interconnect structure 110 are completed, the bump layer 120 may be formed by well-known techniques, such as sputter deposition of under-bump metallization layers followed by a lithography-assisted electroplating process for forming the bumps 121. As previously mentioned, the substrate handling during the formation of the interconnect structure 110 in combination with any CMP processes may result in the formation of cracking and delamination 119 owing to low-k material deposition at the substrate edge and the reduced mechanical stability of the interconnect structure during the CMP process. These yield-compromising factors, in combination with the main source for significant reduction of the yield, that is, the flip-chip bonding of the package substrate 130 to the bump layer 120, especially when organic base portions 132 are used, renders an economic production of sophisticated semiconductor devices including low-k interconnect structure difficult.

In view of the above-identified problems, there exists a need for an improved technique that enables the achievement of higher production yield during the packaging process while still maintaining high performance of advanced semiconductor devices using low-k dielectric materials.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique in which a dielectric material of increased relative permittivity, which typically has an increased mechanical stability compared to low-k dielectrics, is incorporated in intermediate via layers to increase the mechanical stability of the whole interconnect structure including a low-k dielectric material within the metal line layers, thereby substantially maintaining the performance of the device.

According to one illustrative embodiment of the present invention, a semiconductor device comprises a substrate and a first metal line layer formed above the substrate and having a plurality of first metal lines that are laterally embedded in a first dielectric material with a first relative permittivity. Moreover, the semiconductor device comprises a second metal line layer formed above the first metal line layer and having a plurality of second metal lines that are laterally embedded in the first dielectric material. A via connecting at least one of the first metal lines with at least one of the second metal lines is laterally embedded in a second dielectric material having a second relative permittivity that is higher than the first relative permittivity.

According to a further illustrative embodiment of the present invention, a semiconductor device comprises a substrate and a plurality of stacked metal line layers formed above the substrate, wherein each metal line layer comprises a low-k dielectric material with metal lines formed therein. Moreover, at least one intermediate via layer is located between two of the plurality of stacked metal line layers, wherein the at least one intermediate via layer comprises a metal-containing via formed in a dielectric material, at least a portion of which has a higher relative permittivity than the low-k dielectric material.

In accordance with yet another illustrative embodiment of the present invention, a semiconductor device comprises a substrate and a low-k interconnect structure formed above the substrate and including a plurality of metal line layers, each comprising a low-k dielectric material. The interconnect structure further comprises a plurality of intermediate via layers, wherein at least some of the intermediate via layers comprise a dielectric material of higher relative permittivity compared to the low-k dielectric material. Furthermore, a bump layer connected to the low-k interconnect structure of increased mechanical stability and a package substrate attached to the bump layer are provided.

According to still a further illustrative embodiment of the present invention, a method comprises forming a dielectric capping layer above a substrate and forming a first dielectric layer including a dielectric material of a first relative permittivity above the dielectric capping layer. Moreover, a second dielectric layer comprising a low-k dielectric material with a second relative permittivity is formed above the first dielectric layer, wherein the first relative permittivity is higher than the second one. Then, a trench is formed in the second dielectric layer and a via is formed at least in the dielectric capping layer and the first dielectric layer. Finally, the via and the trench are filled with a metal-containing material to form a low-k interconnect structure.

According to yet another illustrative embodiment of the present invention, a method of packaging a semiconductor device including a low-k interconnect structure comprises forming one or more intermediate dielectric layers of higher relative permittivity compared to the low-k material during the formation of a plurality of low-k dielectric layers of the low-k interconnect structure. Furthermore, a bump layer is formed above the interconnect structure and finally a packaged substrate is attached to the bump layer, wherein the one or more layers of increased mechanical stability reduce cracking and delamination of the low-k interconnect structure.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a low-k interconnect structure may effectively be strengthened in that material layers of increased mechanical stability or strength, also usually exhibiting a higher permittivity compared to conventional low-k materials, may be introduced into the interconnect structure at the via levels without unduly compromising the signal propagation characteristics of the interconnect structure. With reference to the figures, further illustrative embodiments of the present invention will now be described in more detail.

Figure 2A:
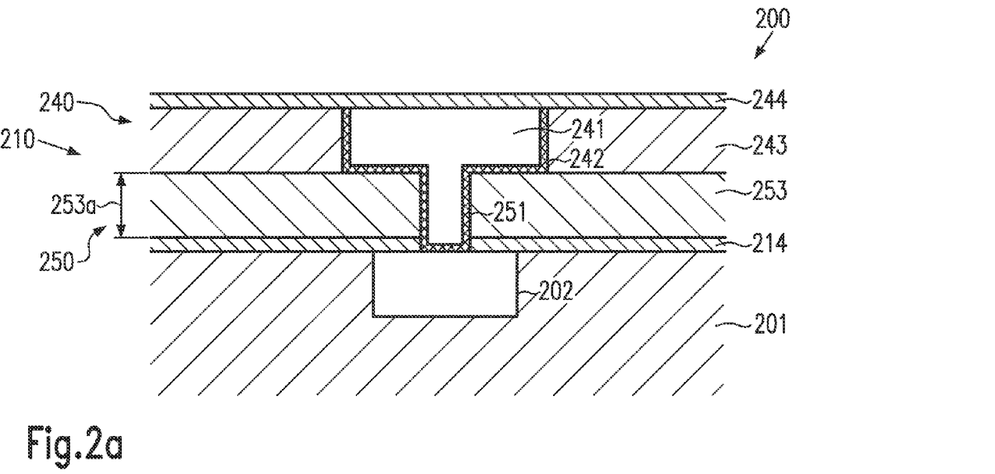
FIGS. 2a-2c schematically show cross-sectional views of an advanced integrated circuit including a low-k interconnect structure of increased mechanical stability during various manufacturing stages in accordance with illustrative embodiments of the present invention.

FIG. 2a schematically shows a cross-sectional view of a semiconductor device 200, which may represent any advanced device requiring a sophisticated interconnect structure including a low-k dielectric material. In this respect, it should be appreciated that the term low-k dielectric material refers to any dielectric material having a relative permittivity of approximately 3.1 and less. Moreover, the term low-k interconnect structure should be understood to describe an interconnect structure including at least partially a low-k dielectric material for reducing the signal propagation delay time compared to an equivalent inter-connect structure that is completely formed of "conventional" dielectric materials, such as silicon dioxide, fluorine-doped silicon dioxide, silicon nitride and the like. Since the effect of signal propagation delay of interconnect structures becomes significant for semiconductor devices of critical dimensions of approximately 0.18 μm and less, the present invention may be employed with devices having critical dimensions of 180 nm and less and especially with devices having critical dimensions of 130 nm and less. However, as will be recognized by those skilled in the art after a complete reading of the present application, the present invention has very broad applications, and, thus, the present invention may also be employed with less advanced device generations.

The semiconductor device 200 comprises a substrate 201 that is representative of any appropriate substrate having formed thereon or therein circuit elements, such as transistors, capacitors, conductive lines, etc., which are for convenience not shown in FIG. 2a. A contact portion 202 formed on the substrate 201 represents any of these circuit elements or portions thereof, wherein a low-k interconnect structure 210 located above the substrate 201 is to provide electrical contact to the contact portion 202. For example, the contact portion 202 may represent a metal line of a lower lying metal line layer or may represent a contact that is directly connected to a circuit element, such as a transistor. As previously noted, a critical design dimension of any circuit element in the substrate 201 may be 130 nm or less. A first capping layer 214 is formed between the substrate 201 and the interconnect structure 210 and may be comprised of a diffusion-blocking material, such as silicon nitride or nitrogen-enriched silicon carbide when the contact portion 202 comprises copper. However, other materials may be used for the capping layer 214, such as silicon dioxide and the like, if, for example, the contact portion 202 represents a direct contact to a circuit element. The low-k interconnect structure 210 formed above the capping layer 214 comprises a metal line layer 240 and an intermediate via layer 250. The metal line layer 240 includes a metal line 241 containing a conductive barrier layer 242 that separates the metal line 241 from the material of a low-k dielectric layer 243. In one illustrative embodiment, the dielectric layer 243 is comprised of hydrogenated silicon oxycarbide (SiCOH), while in other embodiments other materials may be used, such as MSQ, HSQ, SILK, porous SiCOH and the like. The metal line 241 may be comprised of copper or copper alloys while the barrier layer 242 may be comprised of one or more layers including materials such as tantalum, tantalum nitride, titanium, titanium nitride or any combination thereof or any other appropriate materials that provide the required diffusion-blocking and adhesive characteristics. The metal line layer 240 further comprises a capping layer 244, for example comprised of nitrogen-enriched silicon carbide (SiCN).

The intermediate via layer 250 includes a metal-containing via 251, which is simply referred to as via and also comprises the barrier layer 242, which separates the via 251 from a surrounding dielectric layer 253, which is comprised of a dielectric material having an increased mechanical stability or strength compared to the low-k dielectric layer 243. Typically, low-k dielectric materials exhibit a significantly less mechanical stability owing to a reduced density compared to "conventional" dielectric materials, such as silicon dioxide, fluorine-doped silicon dioxide, silicon nitride, which are well-approved and well-known dielectric materials in forming semiconductor devices. In one particular embodiment, the dielectric layer 253 is comprised of fluorine-doped silicon dioxide, which may be deposited from fluorine-doped tetraethylorthosilicate (TEOS) having a relative permittivity of approximately 3.6. In other embodiments, the dielectric layer 253 may be comprised of silicon dioxide deposited from TEOS having a relative permittivity of approximately 4.0 or higher. Typically, the lateral distance or spacing between adjacent vias 251 (only one via 251 is shown for convenience) is significantly greater than a distance between two adjacent metal lines 241 (only one is shown). Therefore, the overall parasitic capacitance between neighboring metal lines and vias is substantially determined by the capacitance formed between adjacent metal lines rather than between adjacent vias so that the increased permittivity of the dielectric layer 253 may not significantly contribute to the total signal propagation delay, while at the same time imparting a significantly higher mechanical stability to the interconnect structure 210. It should be noted that the dielectric layer 253 may not completely be formed from a "conventional" dielectric material but may include, in some embodiments, one or more sublayers of a low-k dielectric material, as will be described in more detail with reference to FIG. 2b.

A typical process flow for forming the semiconductor device 200 as shown in FIG. 2a may comprise the following processes. After the formation of the contact portion 202 and any circuit elements in and on the substrate 201, the capping layer 214 may be deposited by any appropriate well-known deposition techniques, such as PECVD. Thereafter, the dielectric layer 253 is deposited, in one particular embodiment, by PECVD from TEOS including a certain amount of fluorine-containing precursors. Corresponding deposition recipes for depositing a fluorine-doped silicon dioxide layer from TEOS are well established in the field of forming interlayer dielectrics and may readily be applied to the formation of the dielectric layer 253. In particular embodiments, when the silicon dioxide containing dielectric layer 253 is provided with a thickness 253a that substantially corresponds to a depth of the via 251, except for the thickness of the capping layer 214, the via 251 extending through the intermediate via layer 250 may be considered as being laterally embedded into the dielectric layer 253.

After the deposition of the dielectric layer 253, the low-k dielectric layer 243 is formed, for instance, in one particular embodiment, by depositing hydrogenated silicon oxycarbide from oxygen and trimethylsilane (3 MS) in accordance with approved process recipes. In other embodiments, SiCOH may be deposited from 4 MS, OMCTS, or any other appropriate precursors. Next, a via opening may be formed through the dielectric layers 243, 253 and the capping layer 214 by advanced photolithography and anisotropic etch process techniques. Thereafter, a further photolithography process may be carried out to provide a resist mask for forming a trench in the low-k dielectric layer 243 by a further anisotropic etch process. During this anisotropic etch process, the change of material composition between the dielectric layers 243 and 253 may advantageously be used to detect the end of the trench etch process once the etch front reaches the material of the layer 253, as will be described in more detail with reference to FIG. 2c. Thereafter, the barrier layer 242 may be formed within the trench and the via opening followed by the deposition of a seed layer that is used during a subsequent electrochemical fill process for completing the metal line 241 and the via 251 by, for instance, filling in copper or a copper alloy. Thereafter, any excess material produced during the electrochemical metal deposition may be removed by, for instance, chemical mechanical polishing (CMP), wherein the increased mechanical stability of the intermediate via layer 250 also imparts an improved stability to the interconnect structure 210 during the CMP process. Moreover, as previously noted, the semiconductor device 200 may be less prone to any delamination or flaking off of material, especially at the substrate edge, during any substrate handling processes due to the enhanced mechanical stability of the inter-connect structure 210. Finally, the capping lay 244 may be formed, after any pre-clean processes, to passivate an exposed surface of the metal line 241.

Figure 2B:
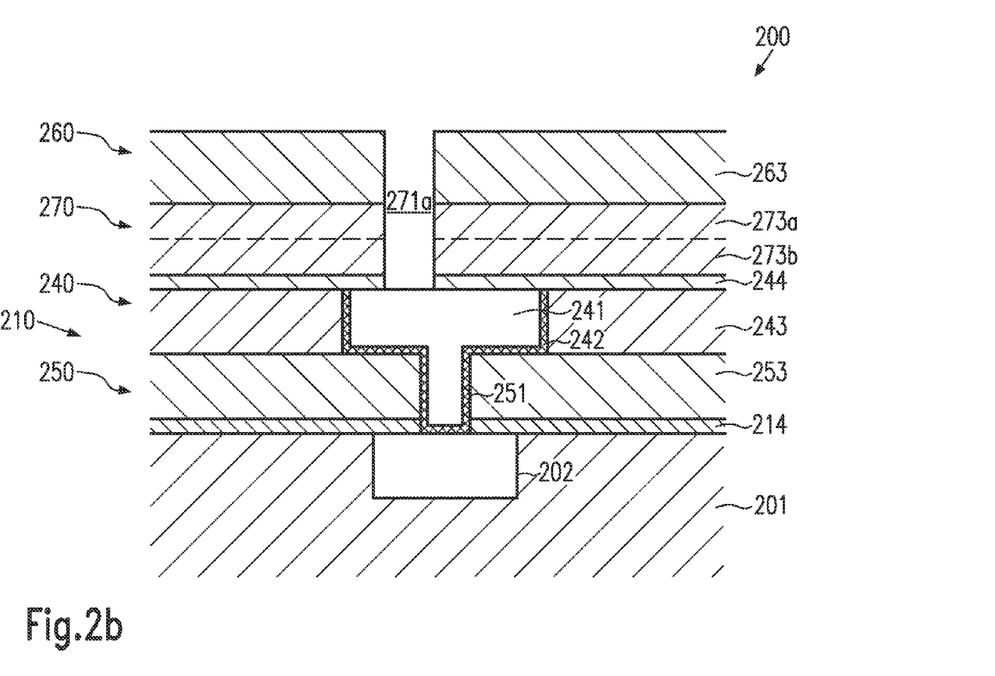

As previously explained, advanced integrated circuits typically require that the inter-connect structure 210 have a plurality of metal line layers and intermediate via layers to provide the required finctionality. With reference to FIG. 2b, the formation of a further pair of metal line layer and intermediate via layer is described and should be considered as representative for the formation of any further metal line layer and intermediate via layer, wherein the number of metal line layers/intermediate via layers depends on the complexity of the integrated circuit under consideration. For instance, presently, microprocessors are available having up to eight metal line layers connected by corresponding intermediate via layers.

FIG. 2b schematically shows the semiconductor device 200, wherein the low-k interconnect structure 210 comprises a second metal line layer 260 and a second intermediate via layer 270, which are formed above the metal line layer 240. The metal line layer 260 may comprise a low-k dielectric layer 263, formed of any appropriate low-k dielectric material, such as SiCOH and the like, and also comprises in this manufacturing stage a via opening 271a, which also extends through the intermediate via layer 270 and the capping layer 244. The intermediate via layer 270 comprises, at least partially, a dielectric material of enhanced mechanical stability similar to the intermediate via layer 250, and may, according to one embodiment, comprise two or more sub-layers of different dielectric materials. In the example shown in FIG. 2b, two sub-layers 273a and 273b are illustrated having comparable thickness, whereas, in other embodiments, more than two sub-layers with substantially equal or differing thicknesses may be provided. In one embodiment, the sub-layer 273a may be comprised of a dielectric material of enhanced mechanical stability, such as silicon dioxide, fluorine-doped silicon dioxide and the like, while the sub-layer 273b may be comprised of a low-k dielectric material, such as SiCOH and the like. In one embodiment, the sub-layer 273a may be comprised of low-k dielectric material and the sub-layer 273b may include the dielectric material of enhanced mechanical stability.

It should be noted that the finally obtained mechanical stability of the low-k inter-connect structure 210 may be estimated on the basis of test substrates including dielectric layer stacks with differing amounts of dielectric material of enhanced mechanical stability. For instance, layer stacks may be formed having a height that substantially corresponds to the finally required height of a specified interconnect structure, wherein the ratio of low-k. dielectric material and dielectric material of enhanced mechanical stability is varied. These test structures may then be subjected to increased mechanical stress, for instance caused by thermal treatment and the like, to evaluate the mechanical strength or stability of these test structures. From these test results, for example, a minimum amount of dielectric material of increased mechanical stability and/or the appropriate distribution, for instance in the form of individual layers of different or equal thickness, and other characteristics may be estimated in the form of quantitative results to arrive at a desired minimal mechanical strength. Based on these estimations, a thickness or amount of a "conventional" dielectric layer within a corresponding intermediate via layer may be derived. Moreover, an appropriate distribution of "conventional" dielectric layers within the layer stack may be determined, as not necessarily in all intermediate via layers a layer of enhanced mechanical stability may be required for each interconnect structure design. The mechanical stability of the test structures may readily be estimated in a quantitative fashion by referring to, for instance, the number of delamination and/or cracking events when subjected to a specified mechanical stress condition.

A typical process flow for forming the semiconductor device 200 as shown in FIG. 2b may be as follows. The sub-layer 273b may be deposited by PECVD, in case the layer 273b is comprised of SiCOH, while, in other embodiments, advanced spin-on techniques may be used to form any low-k polymer materials on the capping layer 244. Thereafter, the sub-layer 273a may be deposited, for instance by PECVD from TEOS in an atmosphere containing a fluorine precursor when a fluorine-doped silicon dioxide is desired. In other embodiments, the layer 273a may be formed from precursors such as silane or 3 MS if the material characteristics of the corresponding silicon dioxide are considered appropriate. For instance, the layers 273b and 273a may be formed in situ, that is within the same process chamber without breaking the vacuum by, for instance, discontinuing the supply of a carrier gas, such as helium, and raising the oxygen flow rate while lowering the 3 MS flow rate, after the layer 273b comprised of SiCOH has been deposited with a desired thickness. The deposition process with the newly adjusted parameters may then be continued until a required thickness for the silicon dioxide layer 273a is achieved. As may be appreciated, this in situ process sequence may advantageously be applied for forming a plurality of intermediate silicon dioxide layers in a low-k SiCOH layer to enhance the mechanical stability of the intermediate via layer 270. After completion of the formation of the intermediate via layer 270, the low-k dielectric layer 263 is formed by, for instance, PECVD, spin-on techniques, and the like. Next, a corresponding resist mask is formed (not shown) and well-approved anisotropic etch techniques are used to form the via opening 271a.

Figure 2C:
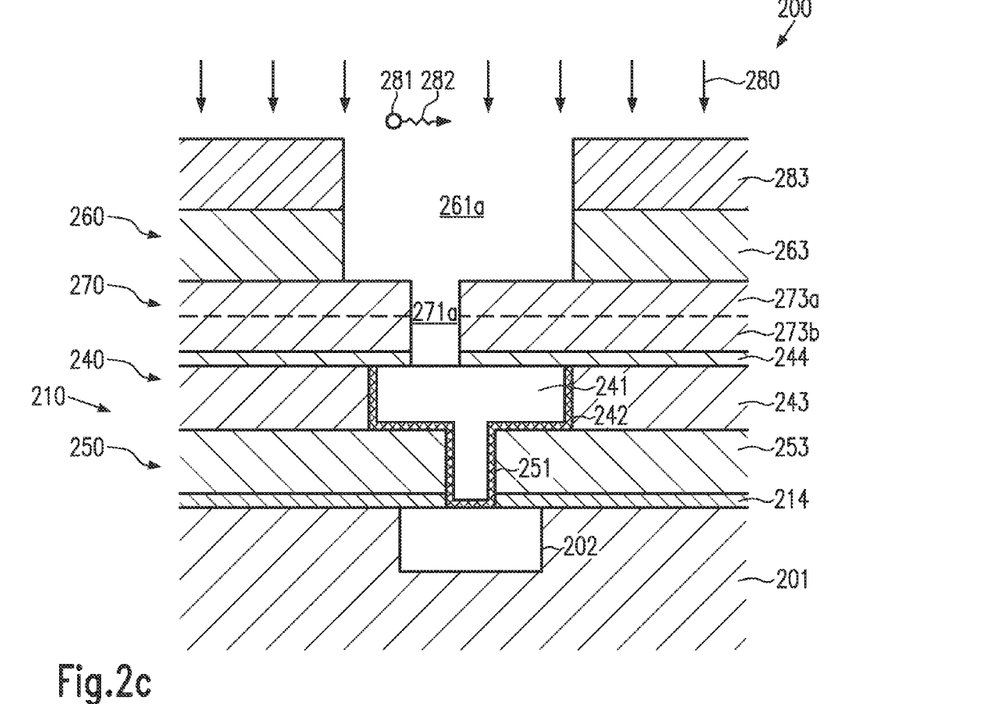

FIG. 2c schematically shows the semiconductor device 200 during an anisotropic etch process, indicated by 280, for forming a trench opening 261a in the metal line layer 260. To this end, a resist mask 283 is formed above the low-k dielectric layer 263, wherein, for convenience, any additional capping layers and/or anti-reflective layers formed within or on the low-k dielectric layer 263 are not shown. The resist mask 283 and possibly any additional capping layers and anti-reflective layers are formed in accordance with well-established deposition and photolithography techniques. Thereafter, the anisotropic etch process 280 is performed, wherein at a final phase of the process gaseous byproducts 281 may be liberated, when the etch front reaches the dielectric layer 273a, which may have, in one embodiment, a different composition, since it may be comprised of silicon dioxide or fluorine-doped silicon dioxide. In particular, excited cyanide (CN) molecules and excited carbon monoxide (CO) molecules may be generated when the etch front arrives at the silicon dioxide layer 273a, wherein these byproducts 281 may emit corresponding light wavelengths 282 that may effectively be detected by a corresponding endpoint detection system (not shown) as it is typically provided in readily available etch tools. Hence, by identifying prominent lines in the light signals 282 especially emitted by cyanide and carbon monoxide molecules 281, the etch process 280 may be stopped with high precision. In other embodiments, when the dielectric layer 273a is comprised of a low-k dielectric material while the layer 273b comprises the material of enhanced mechanical stability, the etch process 280 may be stopped after a specified etch time or, in other embodiments, a relatively thin indicator layer may be provided within the low-k dielectric layer 263 or 273a or at an interface thereof.

After completion of the anisotropic etch process 280, the further process may continue as is described with reference to the metal line layer 240 and the intermediate via layer 250. As previously noted, a plurality of metal line layers/intermediate via layers may be required to complete the interconnect structure 210, wherein not necessarily each of the intermediate via layers needs to be furnished with a dielectric material of enhanced mechanical stability. An appropriate design for the interconnect structure 210 may be obtained from corresponding measurement results of the test structures previously described.

Figure 2D:
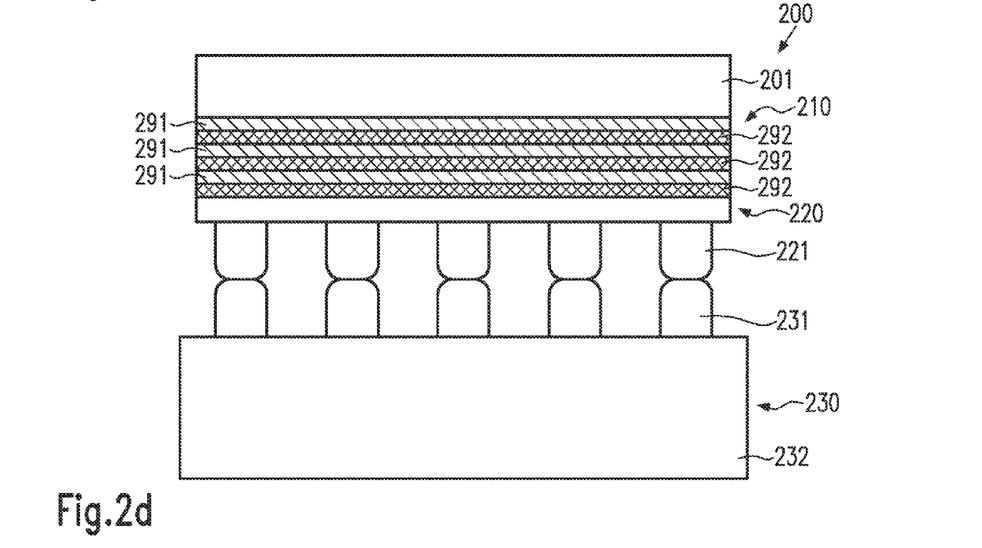
FIG. 2d schematically shows a cross-sectional view of the device of FIGS. 2a-2c with an organic package substrate attached thereto according to illustrative embodiments of the present invention.

FIG. 2d schematically shows the semiconductor device 200 in an advanced manufacturing stage, wherein the device 200 further comprises a bump layer 220 including a plurality of bumps 221, and a package substrate 230 including a base portion 232 and corresponding pads and/or bumps 231. The interconnect structure 210 may comprise a specified number of metal line layers 291 and a corresponding number of intermediate via layers 292 in accordance with design requirements. In one particular embodiment, the intermediate via layers 292 are substantially completely comprised of dielectric material of enhanced mechanical stability, such as silicon dioxide or fluorine-doped silicon dioxide formed from TEOS and metal vias that are laterally embedded therein. On the other hand, the metal line layers may be comprised of low-k dielectric material such as SiCOH with metal lines laterally embedded therein. However, in other embodiments, the interconnect structure 210 may take on any form as is previously described with reference to FIGS. 2a-2c.

The device 200 as shown in FIG. 2d may be formed according to the following processes. After completion of the interconnect structure 210, the bump layer 220 is formed by well-approved techniques, such as sputter deposition of under-bump metallization layers and a subsequent lithography-assisted electroplating of the bumps 221, which may be re-flowed to form solder balls prior to attaching the package substrate 230 to the bump layer 220. During the packaging process, i.e., during the attachment of the package substrate 230 to the bump layer 220, cracking and delamination within the interconnect structure 210 is significantly reduced owing to the increased mechanical stability thereof. Thus, in particular embodiments, the base portion 232 may be made of an organic material, thereby providing significant cost advantages compared to any ceramic materials, while still achieving a high production yield due to the improved interconnect structure 210, wherein performance of the device 200 is substantially maintained compared to an interconnect structure formed of low-k intermediate via layers without material of increased mechanical stability.

As a result, the present invention provides an enhanced technique that enables the formation of advanced interconnect structures, especially for devices having critical design dimensions of 130 nm and below, wherein enhanced performance with respect to signal propagation may be achieved while the mechanical stability of the interconnect structure, especially during the process of packaging, is significantly improved compared to advanced conventional low-k devices. Thus, cost-efficient organic package substrates may effectively be used in combination with high end semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a substrate;
a first metal line layer formed above said substrate, said first metal line layer comprising a plurality of first metal lines laterally embedded in a first single layer of a first dielectric material with a first relative permittivity;
a second metal line layer formed above said first metal line layer, said second metal line layer comprising a plurality of second metal lines laterally embedded in a second single layer of said first dielectric material; and
a via connecting at least one of said first metal lines with at least one of said second metal lines, said via being laterally embedded in a single layer of a second dielectric material having a second relative permittivity that is higher than said first relative permittivity, said single layer of said second dielectric material having an upper surface that contacts a bottom surface of said second single layer of said first dielectric material of said second metal line layer, said single layer of said second dielectric material having a thickness that substantially corresponds to a distance between the first and second metal lines, and said second dielectric material having increased mechanical stability or strength relative to the first dielectric material.

2. The semiconductor device of claim 1, wherein a minimal critical design dimension of a device formed on said substrate is 130 nm or less.

3. The semiconductor device of claim 1, wherein said second dielectric material is comprised of fluorine-doped silicon dioxide.

4. The semiconductor device of claim 1, wherein said second dielectric material is comprised of silicon dioxide and has a thickness that substantially corresponds to a depth of the via.

5. The semiconductor device of claim 1, wherein said first dielectric material is comprised of hydrogenated silicon oxycarbide (SiCOH).

6. The semiconductor device of claim 1, wherein said device comprises more than two metal line layers each having a plurality of metal lines formed therein, adjacent ones of said more than two metal line layers being electrically connected by one or more vias, wherein each of the metal lines is embedded in said first dielectric material and each via is embedded in said second dielectric material contacting said first dielectric material, and wherein said second dielectric material has a thickness that substantially corresponds to a distance between metal lines formed in the adjacent ones of said more than two metal line layers.

7. The semiconductor device of claim 1, wherein said device comprises at least one further metal line layer having a plurality of metal lines formed therein, and at least one further via connecting to an adjacent metal line layer, wherein each of the metal lines of said at least one further metal line layer and said at least one further via are each laterally embedded in said first dielectric material.

8. The semiconductor device of claim 1, wherein an upper surface of each of each of the metal lines in said first and second metal line layers is partially covered by a diffusion-blocking material.

9. A semiconductor device, comprising:
a substrate;
a plurality of stacked metal line layers formed above said substrate, each metal line layer comprising a low-k dielectric material with a plurality of metal lines formed therein; and
at least one intermediate via layer located between two of said plurality of stacked metal line layers and in contact with one of said plurality of stacked metal line layers, said at least one intermediate via layer comprising a metal-containing via formed in at least first and second sub-layers that contact one another along an interface, wherein said first sub-layer is comprised of a first dielectric support material and said second sub-layer is comprised of a low-k dielectric material, said first dielectric support material having a higher relative permittivity than said low-k dielectric material in said second sub-layer, wherein said first sub-layer and said second sub-layer have a combined thickness that substantially corresponds to a vertical distance between a vertically spaced-apart pair of the plurality of metal lines, and wherein said first sub-layer of said first dielectric support material has increased mechanical stability or strength relative to the low-k dielectric material in said second sub-layer.

10. The semiconductor device of claim 9, wherein said first sub-layer is positioned above said second sub-layer.

11. The semiconductor device of claim 9, wherein said second low-k dielectric material is the same as said low-k dielectric material.

12. The semiconductor device of claim 9, wherein said first sub-layer is positioned below said second sub-layer.

13. The semiconductor device of claim 9, wherein said first sub-layer of the intermediate via layer comprises at least one of a fluorine-doped silicon dioxide and silicon dioxide.

14. The semiconductor device of claim 9, wherein said low-k dielectric material in said second sub-layer comprises hydrogenated silicon oxycarbide (SiCOH).

15. The semiconductor device of claim 9, wherein a minimal critical design dimension of the semiconductor device is 130 nm or less.

16. The semiconductor device of claim 9, wherein the plurality of stacked metal line layers comprises at least one capping layer comprising a diffusion-blocking material.

17. The semiconductor device of claim 16, further comprising at least one capping layer formed on at least one surface of said at least one intermediate via layer using nitrogen-enriched silicon carbide.

18. A semiconductor device, comprising:
a substrate;
a first metal line layer formed above said substrate, said first metal line layer comprising a plurality of first metal lines laterally embedded in a first dielectric material with a first relative permittivity; and
a second metal line layer formed above said first metal line layer, said second metal line layer comprising a plurality of second metal lines laterally embedded in a separate layer of said first dielectric material, said second metal line layer comprising a via connecting at least one of said first metal lines with at least one of said second metal lines, said via being laterally embedded in a second dielectric material having a second relative permittivity that is higher than said first relative permittivity, said second dielectric material having an upper surface that contacts a bottom surface of said first dielectric material in said second metal line layer along a substantially horizontally oriented interface, and said second dielectric material having increased mechanical stability or strength relative to the first dielectric material.

19. The semiconductor device of claim 18, wherein said second dielectric material has a thickness that substantially corresponds to a distance between the first and second metal lines.

* * * * *